US012611698B2

(12) United States Patent
Chiu et al.

(10) Patent No.: US 12,611,698 B2
(45) Date of Patent: Apr. 28, 2026

(54) WAFER LEVEL ULTRASONIC DEVICE

(71) Applicant: SonicMEMS (ZhengZhou) Technology Co., Ltd., Zhengzhou (CN)

(72) Inventors: Yi-Hsiang Chiu, Zhengzhou (CN); Hung-Ping Lee, Zhengzhou (CN)

(73) Assignee: SonicMEMS (ZhengZhou) Technology Co., Ltd., Zhengzhou (CN)

( * ) Notice: Subject to any disclaimer, the term of this patent is extended or adjusted under 35 U.S.C. 154(b) by 421 days.

(21) Appl. No.: 18/471,368

(22) Filed: Sep. 21, 2023

(65) Prior Publication Data

US 2024/0009703 A1     Jan. 11, 2024

Related U.S. Application Data

(62) Division of application No. 16/875,525, filed on May 15, 2020, now Pat. No. 11,806,751.

(30) Foreign Application Priority Data

Dec. 4, 2019    (TW) ................................. 108144395

(51) Int. Cl.
B06B 1/06          (2006.01)
G06V 40/13        (2022.01)
        (Continued)

(52) U.S. Cl.
CPC .......... B06B 1/0622 (2013.01); B06B 1/0611 (2013.01); G06V 40/1306 (2022.01);
        (Continued)

(58) Field of Classification Search
CPC . B06B 1/0622; B06B 1/0611; G06V 40/1306; G06V 40/1329; H10N 30/06; H10N 30/072; H10N 30/02; H10N 30/2047; H10N 30/082; H10N 30/883; H10N 30/875; H10N 30/101
See application file for complete search history.

(56) References Cited

U.S. PATENT DOCUMENTS

| | | |
|---|---|---|
| 11,075,072 B2 | 7/2021 | Jin |
| 2015/0256144 A1* | 9/2015 | Andosca .............. H03H 3/0072 |
| | | 216/13 |

(Continued)

*Primary Examiner* — Brigitte A Paterson
(74) *Attorney, Agent, or Firm* — MUNCY, GEISSLER, OLDS & LOWE, P.C.

(57)        ABSTRACT

A wafer level ultrasonic device includes a composite layer, a first conductive layer, a second conductive layer, a base, a first electrical connection region, and a second electrical connection region. The composite layer includes an ultrasonic element and a protective layer. The ultrasonic element includes a first electrode and a second electrode. The protective layer has a first connecting channel and a second connecting channel respectively corresponding to the first electrode and the second electrode. The first conductive layer and the second conductive layer are respectively in the first connecting channel and the second connecting channel to connect the first electrode and the second electrode. The base includes an opening forming a closed cavity with the protective layer. The first electrical connection region and the second electrical connection region are respectively filled with metal materials to electrically connect the first conductive layer and the second conductive layer.

12 Claims, 2 Drawing Sheets

(51) Int. Cl.

| | |
|---|---|
| *H10N 30/00* | (2023.01) |
| *H10N 30/02* | (2023.01) |
| *H10N 30/06* | (2023.01) |
| *H10N 30/072* | (2023.01) |
| *H10N 30/082* | (2023.01) |
| *H10N 30/20* | (2023.01) |
| *H10N 30/87* | (2023.01) |
| *H10N 30/88* | (2023.01) |

(52) U.S. Cl.
CPC ......... *G06V 40/1329* (2022.01); *H10N 30/02* (2023.02); *H10N 30/06* (2023.02); *H10N 30/072* (2023.02); *H10N 30/082* (2023.02); *H10N 30/101* (2024.05); *H10N 30/2047* (2023.02); *H10N 30/875* (2023.02); *H10N 30/883* (2023.02)

(56) References Cited

U.S. PATENT DOCUMENTS

| | | | |
|---|---|---|---|
| 2017/0128983 | A1 | 5/2017 | Horsley |
| 2019/0262865 | A1 | 8/2019 | Mehdizadeh |
| 2020/0035654 | A1 | 1/2020 | Chen |
| 2020/0179979 | A1 | 6/2020 | Jin |
| 2020/0191646 | A1 | 6/2020 | Jin |
| 2020/0313073 | A1 | 10/2020 | Wang |
| 2021/0013026 | A1 | 1/2021 | Jin |
| 2021/0193903 | A1 | 6/2021 | Shi |

* cited by examiner

WAFER LEVEL ULTRASONIC DEVICE

CROSS-REFERENCE TO RELATED APPLICATION

This non-provisional application is a Division of application Ser. No. 16/875,525, filed on May 15, 2020, with claiming priority under 35 U.S.C. § 119(a) to Patent Application No. 108144395 in Taiwan, R.O.C. on Dec. 4, 2019, the entire contents of which are hereby incorporated by reference.

BACKGROUND

Technical Field

The present invention relates to an ultrasonic transmission technology, and in particular, to a wafer level ultrasonic device and a manufacturing method thereof.

Related Art

With the development of smartphones and application programs, an increasing scope of individual life is covered. For example, smartphones are widely applied to mobile payment, electronic keys, and the like nowadays. A large amount of important individual information is stored in the smartphone. Therefore, once the smartphone is missing, the information is likely to be stolen, resulting in a great loss.

Therefore, in addition to setting a password generally, many functions such as face recognition, iris recognition, and fingerprint recognition, which use a personal feature to assist in encryption, have been developed. Fingerprint recognition is used most commonly at present, which, however, still has the problem of inaccurate recognition.

In the current fingerprint recognition technology, a finger touches an upper cover of an ultrasonic module or a screen protective layer of a smart electronic device; the ultrasonic module sends an ultrasonic signal to the finger and receives a strength of the ultrasonic signal reflected by peaks and roughs of the fingerprint, so that the fingerprint can be recognized. However, the ultrasonic signal of the ultrasonic module may be transmitted to an area not in contact with the finger through a medium. In this case, the reflected ultrasonic signal received by the ultrasonic module may not necessarily be reflected by the finger. Therefore, it is difficult to recognize the fingerprint.

SUMMARY

It should be understood that, when an element is referred to as being "connected to" another element, it may indicate that the element is directly connected to the another element, or there is a middle element.

In addition, it should be understood that although terms such as "first", "second", and "third" in this specification may be used for describing various elements, components, areas, or parts, the elements, components, areas, or parts are not limited by such terms. The terms are only used to distinguish one element, component, area, or part from another element, component, area, or part.

In addition, terms such as "on", "below", "top", and "bottom" are used for describing a relative relationship between one element and another element. It should be understood that such relative terms are intended to encompass different orientations of the device in addition to the orientation depicted in the figures. For example, if the device in the figures is turned over, an element described as being "below" another element will then be "above" the other element.

To solve the foregoing problems, a wafer level ultrasonic device is provided herein, including a composite layer, a first conductive layer, a second conductive layer, a base, a first electrical connection region, and a second electrical connection region. The composite layer includes an ultrasonic element and a protective layer, the ultrasonic element includes a first electrode and a second electrode, and the first electrode is not connected to the second electrode. The protective layer covers the ultrasonic element and is provided with a first connecting channel and a second connecting channel, one end of the first connecting channel corresponds to the first electrode, and one end of the second connecting channel corresponds to the second electrode. The first conductive layer is in the first connecting channel and is electrically connected to the first electrode, and a part of the first conductive layer is exposed to the protective layer. The second conductive layer is in the second connecting channel and is electrically connected to the second electrode, and a part of the second conductive layer is exposed to the protective layer. The base is connected to the protective layer, and includes an opening. The opening forms a closed cavity with the protective layer. The first electrical connection region is filled with a metal material to be electrically connected to the first conductive layer. The second electrical connection region is filled with a metal material to be electrically connected to the second conductive layer.

In some embodiments, the ultrasonic element includes a first piezoelectric layer, the first electrode, a second piezoelectric layer, and the second electrode. The first electrode is on the first piezoelectric layer, the second piezoelectric layer is on the first electrode, the second electrode is on the second piezoelectric layer, and the second piezoelectric layer and the second electrode do not cover the first electrode completely.

In more detail, in some embodiments, the protective layer includes a first protective layer and a second protective layer. The first protective layer covers the ultrasonic element, and exposes a part of the first electrode and a part of the second electrode. The first conductive layer and the second conductive layer are on the first protective layer, and are connected to the first electrode and the second electrode respectively. The second protective layer covers the first conductive layer, the second conductive layer, and the first protective layer, and exposes a part of the first conductive layer and a part of the second conductive layer.

In some embodiments, the ultrasonic element includes a first ultrasonic unit and a second ultrasonic unit. The first ultrasonic unit includes the first piezoelectric layer and the first electrode, the first piezoelectric layer covers the first electrode, and the first piezoelectric layer is provided with a contact hole, to expose a part of the first electrode. The second ultrasonic unit does not overlap the first ultrasonic unit in a direction perpendicular to a substrate. The second ultrasonic unit includes the second piezoelectric layer, a second circuit layer, and the second electrode. The second piezoelectric layer and the first piezoelectric layer are in a same layer and are separated from each other. The second circuit layer is covered in the second piezoelectric layer. The second circuit layer and the first electrode are in a same layer and are separated from each other, and the second electrode is on the second piezoelectric layer.

Furthermore, in some embodiments, the protective layer includes a first protective layer and a second protective layer. The first protective layer covers the first ultrasonic unit and the second ultrasonic unit. The first protective layer is provided with a first communicating hole and a second communicating hole. The first communicating hole is in communication with a contact hole, and the second communicating hole exposes a part of the second electrode. The first conductive layer is filled into the contact hole and the first communicating hole and is connected to the first electrode. The second conductive layer is filled into a part of the second communicating hole and is connected to the second electrode. The second protective layer covers the first conductive layer, the second conductive layer, the first protective layer, and the second electrode, and exposes a part of the first conductive layer and a part of the second conductive layer.

In more detail, in some embodiments, the first piezoelectric layer includes a first bottom piezoelectric layer and a first top piezoelectric layer. The first electrode is on the first bottom piezoelectric layer, and is covered by the first top piezoelectric layer. The first top piezoelectric layer includes the contact hole to expose a part of the electrode, the second piezoelectric layer includes a second bottom piezoelectric layer and a second top piezoelectric layer. The second circuit layer is on the second bottom piezoelectric layer, and is covered by the second top piezoelectric layer. The second electrode is on the second top piezoelectric layer.

In more detail, in some embodiments, the first electrical connection region and the second electrical connection region are through holes penetrating the base. Furthermore, the wafer level ultrasonic device further includes two bonding pads. The bonding pads are on one side, away from the protective layer, of the base, and are respectively connected to the metal materials in the first electrical connection region and the second electrical connection region.

In some other embodiments, the first electrical connection region and the second electrical connection region are side edges on the base.

In some embodiments, the base is made of glass.

Based on the foregoing, by using the closed cavity between the base and the protective layer, the speed of ultrasonic transmission through vacuum and a general medium changes obviously. Therefore, a transfer direction of a signal can be clearly distinguished. Furthermore, because a propagation direction of an ultrasonic signal may be recognized clearly, functions such as gesture sensing may be further provided, and can be applied to a tablet and a television with a large size.

DETAILED DESCRIPTION

Figure 1:
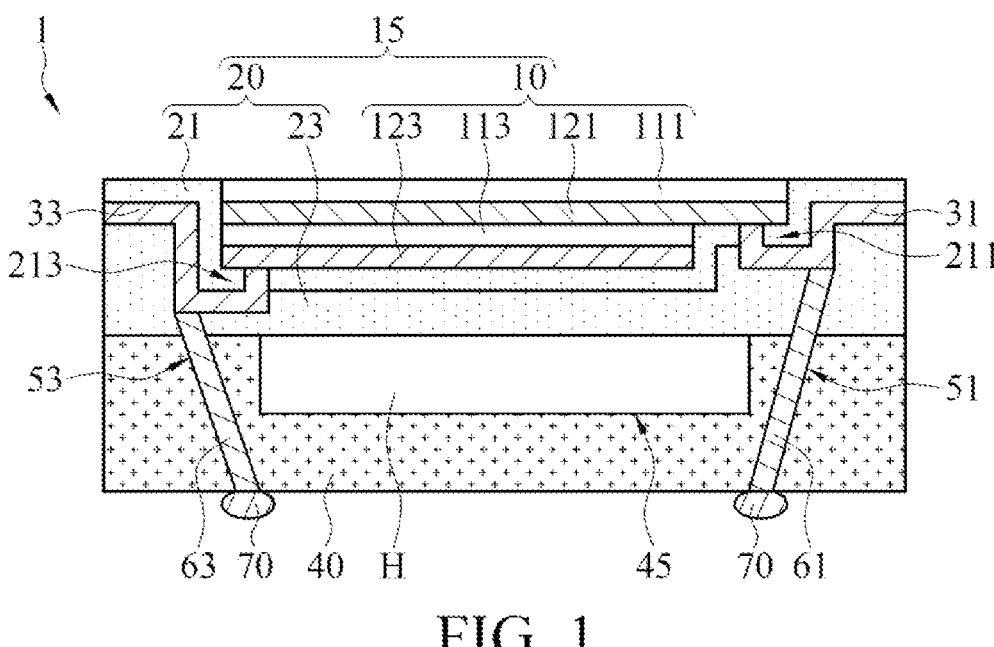
FIG. 1 is schematic cross-sectional view of a wafer level ultrasonic device according to a first embodiment.

FIG. 1 is schematic cross-sectional view of a wafer level ultrasonic device according to a first embodiment. As shown in FIG. 1, the wafer level ultrasonic device 1 of the first embodiment includes a composite layer 15, a first conductive layer 31, a second conductive layer 33, a base 40, a first electrical connection region 51, and a second electrical connection region 53. The composite layer 15 includes an ultrasonic element 10 and a protective layer 20. The ultrasonic element 10 includes a first electrode 121 and a second electrode 123. The first electrode 121 is not connected to the second electrode 123. The protective layer 20 covers the ultrasonic element 10 and is provided with a first connecting channel 211 and a second connecting channel 213. One end of the first connection channel 211 corresponds to the first electrode 121, and one end of the second connection channel 213 corresponds to the second electrode 123. The first conductive layer 31 is in the first connecting channel 211 and is electrically connected to the first electrode 121. The second conductive layer 33 is in the second connecting channel 213 and is electrically connected to the second electrode 123. Parts of the first conductive layer 31 and the second conductive layer 33 are exposed to the protective layer 20. The base 40 is connected to the protective layer 20. The base 40 includes an opening 45, and after the base 40 is connected to the protective layer 20, the opening 45 forms a closed cavity H with the protective layer 20. The first electrical connection region 51 is filled with a metal material 61 to be electrically connected to the first conductive layer 31. The second electrical connection region 53 is filled with a metal material 63 to be electrically connected to the second conductive layer 33.

In more detail, in the first embodiment, the ultrasonic element 10 includes a first piezoelectric layer 111, the first electrode 121, a second piezoelectric layer 113, and the second electrode 123. The first electrode 121 is on the first piezoelectric layer 111. The second piezoelectric layer 113 is on the first electrode 121. The second electrode 123 is on the second piezoelectric layer 113. The second piezoelectric layer 113 and the second electrode 123 do not cover the first electrode 121 completely. Herein, "on" indicates a stacking relationship between elements, but does not indicate an absolute direction relationship.

The protective layer 20 includes a first protective layer 21 and a second protective layer 23. The first protective layer 21 covers the ultrasonic element 10, and exposes a part of the first electrode 121 and a part of the second electrode 123. The first conductive layer 31 and the second conductive layer 33 are on the first protective layer 21, and are connected to the first electrode 121 and the second electrode 123 respectively. The second protective layer 23 covers the first conductive layer 31, the second conductive layer 33, and the first protective layer 21, and exposes a part of the first conductive layer 31 and a part of the second conductive layer 33. In other words, the first connecting channel 211 and the second connecting channel 213 respectively provide, between the first protective layer 21 and the second protective layer 23, space for receiving the first conductive layer 31 and the second conductive layer 33 so as to be connected to the first electrode 121 and the second electrode 123 respectively.

In the first embodiment, the first electrical connection region 51 and the second electrical connection region 53 are through holes penetrating the base 40, and correspond to the first conductive layer 31 and the second conductive layer 33 respectively. The metal materials 61 and 63 are connected to the first conductive layer 31 and the second conductive layer 33 through the first electrical connection region 51 and the second electrical connection region 53. Herein, the first electrical connection region 51 and the second electrical connection region 53 in the figure are oblique, but are not limited thereto actually. In addition, the wafer level ultrasonic device 1 further includes two bonding pads 70. The bonding pads 70 are on one side, away from the protective layer 20, of the base 40 separately, and are respectively connected to the metal materials 61 and 63 in the first electrical connection region 51 and the second electrical connection region 53. The bonding pads 70 may have a relatively large size, to be connected to a circuit board (not shown in the figure).

Herein, the base 40 may be made of glass. However, this is only an example, and is not intended for limitation. Other materials, for example, silicon wafers and quartz, may also be used.

Figure 2:
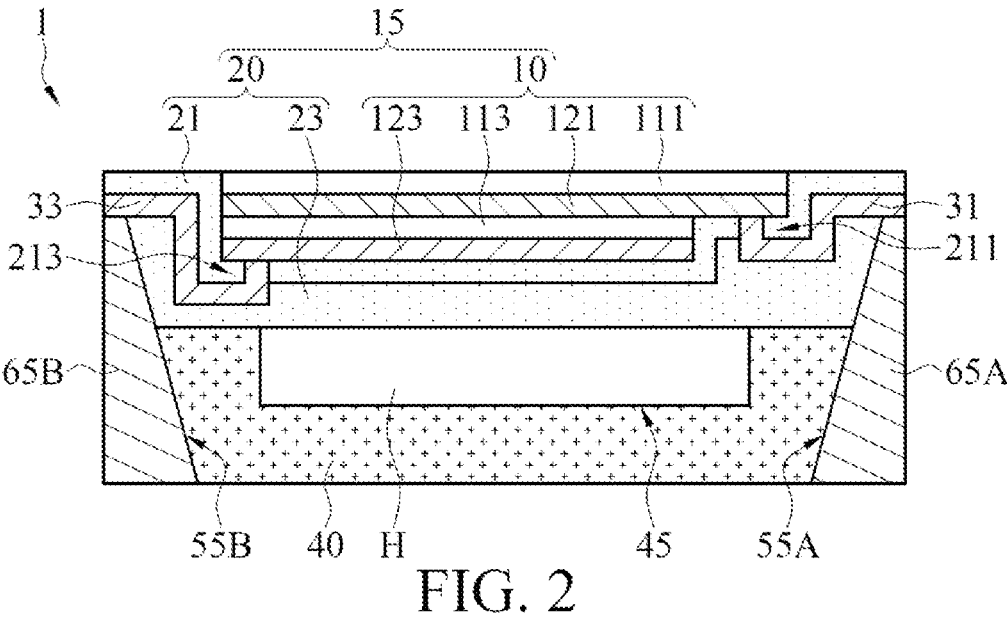
FIG. 2 is schematic cross-sectional view of a wafer level ultrasonic device according to a second embodiment.

FIG. 2 is schematic cross-sectional view of a wafer level ultrasonic device according to a second embodiment. As shown in FIG. 2, and with reference to FIG. 1, a main difference between the first embodiment and the second embodiment is a structure of the base 40. The base 40 of the second embodiment is bowl-shaped. A first electrical connection region 55A and a second electrical connection region 55B are side edges at the base 40 and the protective layer 20, and are filled with metal materials 65A and 65B in a lump form to be connected to the first conductive layer 31 and the second conductive layer 33.

Figure 3:
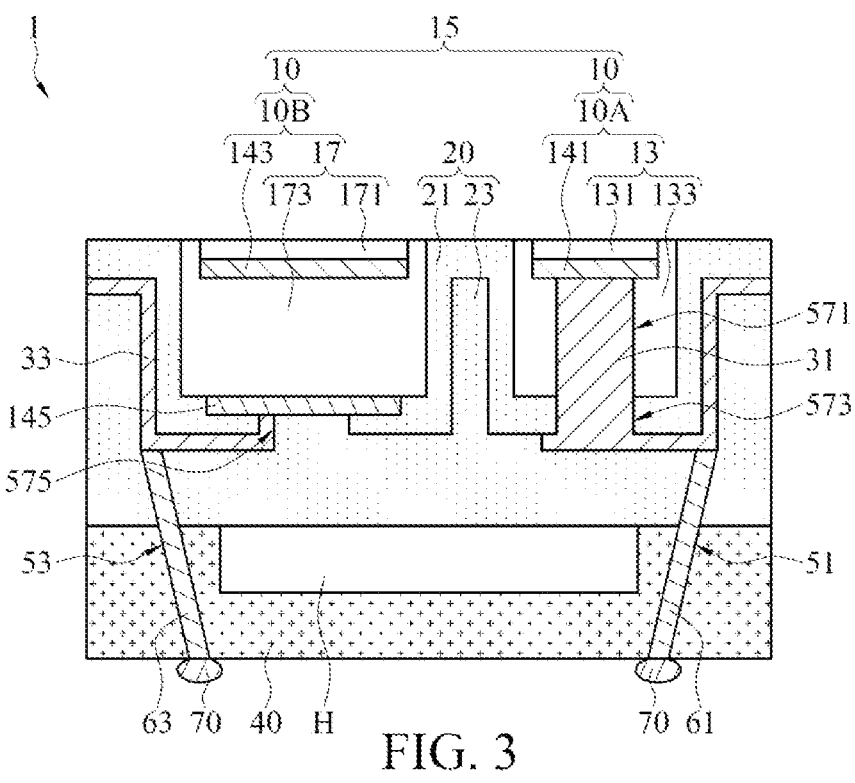
FIG. 3 is schematic cross-sectional view of a wafer level ultrasonic device according to a third embodiment.

FIG. 3 is schematic cross-sectional view of a wafer level ultrasonic device according to a third embodiment. As shown in FIG. 3, and with reference to FIG. 1, a main difference between the third embodiment and the first embodiment is a structure of the composite layer 15. As shown in FIG. 3, the ultrasonic element 10 of the third embodiment includes a first ultrasonic unit 10A and a second ultrasonic unit 10B. The first ultrasonic unit 10A includes a first piezoelectric layer 13 and a first electrode 141. The first piezoelectric layer 13 covers the first electrode 141. The first piezoelectric layer 13 is provided with a contact hole 571, to expose a part of the first electrode 141. The second ultrasonic unit 10B does not overlap the first ultrasonic unit 10A in a direction perpendicular to a substrate. The second ultrasonic unit 10B includes a second piezoelectric layer 17, a second circuit layer 143, and a second electrode 145. The second piezoelectric layer 17 and the first piezoelectric layer 13 are in a same layer and are separated from each other. The second circuit layer 143 is covered in the second piezoelectric layer 17. The second circuit layer 143 and the first electrode 141 are in a same layer and are separated from each other, and the second electrode 145 is on the second piezoelectric layer 17.

In more detail, in the third embodiment, similar to the first embodiment and the second embodiment, the protective layer 20 includes the first protective layer 21 and the second protective layer 23. The first protective layer 21 covers the first ultrasonic unit 10A and the second ultrasonic unit 10B. The first protective layer 21 is provided with a first communicating hole 573 and a second communicating hole 575, and the first communicating hole 573 is in communication with the contact hole 571. The second communicating hole 575 exposes a part of the second electrode 145. The first conductive layer 31 is filled into the contact hole 571 and the first communicating hole 573 and is connected to the first electrode 141. The second conductive layer 33 is filled into a part of the second communicating hole 575 and is connected to the second electrode 145. The second protective layer 23 covers the first conductive layer 31, the second conductive layer 33, the first protective layer 21, and the second electrode 145, and exposes a part of the first conductive layer 31 and a part of the second conductive layer 33, to be in electrical conduction with the metal materials 61 and 63 filled in the first electrical connection region 51 and the second electrical connection region 53 in the base 40.

Referring to FIG. 3 again, the first piezoelectric layer 13 includes a first bottom piezoelectric layer 131 and a first top piezoelectric layer 133. The first electrode 141 is on the first bottom piezoelectric layer 131, and is covered by the first top piezoelectric layer 133. The first top piezoelectric layer 133 includes the contact hole 571 to expose a part of the first electrode 141. The second piezoelectric layer 17 includes a second bottom piezoelectric layer 171 and a second top piezoelectric layer 173. The second circuit layer 143 is on the second bottom piezoelectric layer 171, and is covered by the second top piezoelectric layer 173. The second electrode 145 is on the second top piezoelectric layer 173. Similarly, herein, "top" and "bottom" indicate a mutual relationship of stacking, but not indicate an absolute direction relationship.

Figure 4:
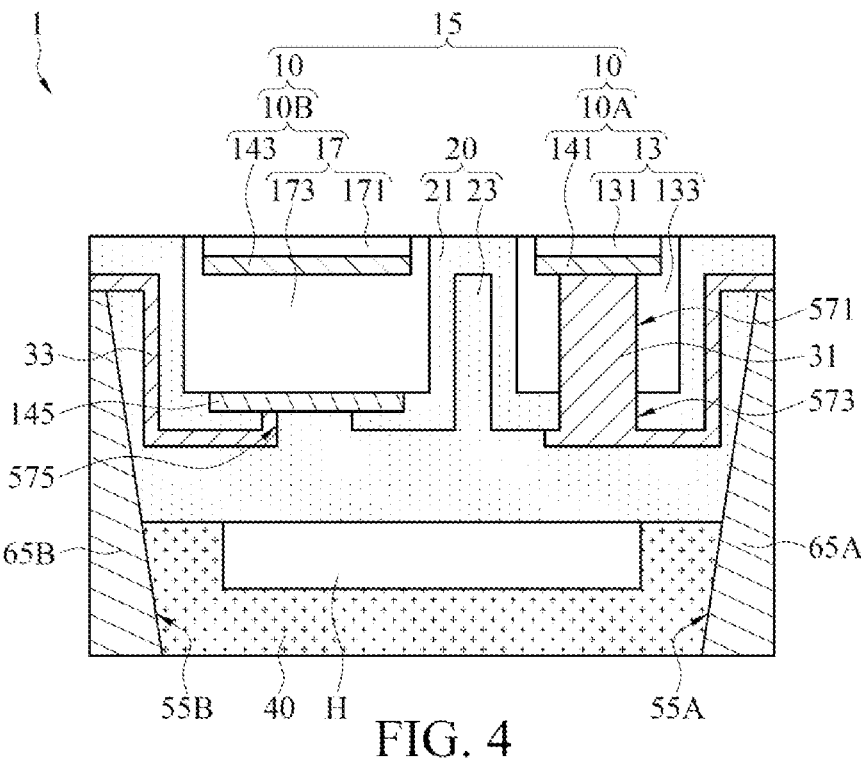
FIG. 4 is schematic cross-sectional view of a wafer level ultrasonic device according to a fourth embodiment.

FIG. 4 is schematic cross-sectional view of a wafer level ultrasonic device according to a fourth embodiment. As shown in FIG. 4, the fourth embodiment may be a combination of the structure of the base 40 at a lower part of the second embodiment and a structure of an upper half part of the third embodiment, and details are not described herein again.

Based on the foregoing, by using the closed cavity H between the base 40 and the protective layer 20 of the wafer level ultrasonic device, the speed of ultrasonic transmission through vacuum and a general medium changes obviously. Therefore, a transfer direction of a signal can be clearly distinguished. In addition to fingerprint recognition, functions such as gesture sensing may be further provided though a high resolution of the wafer level ultrasonic device. In addition, a manufacturing process is simple, and a manufacturing cost may be reduced greatly.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wafer level ultrasonic device, comprising:
   a composite layer comprising an ultrasonic element and a protective layer, wherein the ultrasonic element comprises a first electrode and a second electrode, the first electrode is not connected to the second electrode, the protective layer covers the ultrasonic element and has a first connecting channel and a second connecting channel, one end of the first connecting channel corresponds the first electrode, and one end of the second connecting channel corresponds to the second electrode;
   a first conductive layer in the first connecting channel and electrically connected to the first electrode, wherein a first part of the first conductive layer is exposed to the protective layer;
   a second conductive layer in the second connecting channel and electrically connected to the second electrode, wherein a first part of the second conductive layer is exposed to the protective layer;
   a base connected to the protective layer, wherein the base comprises an opening, and the opening defines a closed cavity with the protective layer;
   a first electrical connection region, wherein the first electrical connection region extends through the base and is filled with a metal material to be electrically connected to the first conductive layer; and
   a second electrical connection region, wherein the second electrical connection region extends through the base and is filled with the metal material to be electrically connected to the second conductive layer.

2. The wafer level ultrasonic device according to claim 1, wherein the ultrasonic element comprises a first piezoelectric layer, the first electrode, a second piezoelectric layer, and the second electrode, the first electrode is on the first piezoelectric layer, the second piezoelectric layer is on the first electrode, the second electrode is on the second piezoelectric layer, and the second piezoelectric layer and the second electrode do not completely cover the first electrode.

3. The wafer level ultrasonic device according to claim 2, wherein the protective layer comprises a first protective layer and a second protective layer, the first protective layer covers the ultrasonic element and exposes a part of the first electrode and a part of the second electrode, the first conductive layer and the second conductive layer are on the first protective layer and are respectively connected to the first electrode and the second electrode, and the second protective layer covers the first conductive layer, the second conductive layer, and the first protective layer and the second protective layer exposes a second part of the first conductive layer and a second part of the second conductive layer.

4. The wafer level ultrasonic device according to claim 1, wherein the protective layer comprises a first protective layer and a second protective layer, the first protective layer covers the first ultrasonic unit and the second ultrasonic unit, the first protective layer is provided with a first communicating hole and a second communicating hole, the first communicating hole is in communication with the contact hole, the second communicating hole exposes a part of the second electrode, the first conductive layer and the second conductive layer are on the first protective layer, the first conductive layer is filled into the contact hole and the first communicating hole and is connected to the first electrode, the second conductive layer is filled into a part of the second communicating hole and is connected to the second electrode, and the second protective layer covers the first conductive layer, the second conductive layer, the first protective layer, and the second electrode and exposes a third part of the first conductive layer and a third part of the second conductive layer.

5. The wafer level ultrasonic device according to claim 4, wherein the protective layer comprises a first protective layer and a second protective layer, the first protective layer covers the first ultrasonic unit and the second ultrasonic unit, the first protective layer is provided with a first communicating hole and a second communicating hole, the first communicating hole is in communication with the contact hole, the second communicating hole exposes a part of the second electrode, the first conductive layer and the second conductive layer are on the first protective layer, the first conductive layer is filled into the contact hole and the first communicating hole and is connected to the first electrode, the second conductive layer is filled into a part of the second communicating hole and is connected to the second electrode, and the second protective layer covers the first conductive layer, the second conductive layer, the first protective layer, and the second electrode and exposes a yhirdpart of the first conductive layer and a third part of the second conductive layer.

6. The wafer level ultrasonic device according to claim 4, wherein the first piezoelectric layer comprises a first bottom piezoelectric layer and a first top piezoelectric layer, the first electrode is on the first bottom piezoelectric layer, and is covered by the first top piezoelectric layer, the first top piezoelectric layer comprises the contact hole to expose a part of the first electrode, the second piezoelectric layer comprises a second bottom piezoelectric layer and a second top piezoelectric layer, the second circuit layer is on the second bottom piezoelectric layer and is covered by the second top piezoelectric layer, and the second electrode is on the second top piezoelectric layer.

7. The wafer level ultrasonic device according to claim 2, wherein the first electrical connection region and the second electrical connection region are through holes penetrating the base.

8. The wafer level ultrasonic device according to claim 4, wherein the first electrical connection region and the second electrical connection region are through holes penetrating the base.

9. The wafer level ultrasonic device according to claim 7, further comprising two bonding pads, wherein the two bonding pads are on one side, away from the protective layer, of the base, and are respectively connected to the metal materials in the first electrical connection region and the second electrical connection region.

10. The wafer level ultrasonic device according to claim 2, wherein the first electrical connection region and the second electrical connection region are side edges at the base and the protective layer.

11. The wafer level ultrasonic device according to claim 4, wherein the first electrical connection region and the second electrical connection region are side edges at the base and the protective layer.

12. The wafer level ultrasonic device according to claim 1, wherein the base is made of glass.

* * * * *